(12) United States Patent
Lee et al.

(10) Patent No.: US 7,978,490 B2
(45) Date of Patent: Jul. 12, 2011

(54) CONTENT ADDRESSABLE MEMORY CELL AND CONTENT ADDRESSABLE MEMORY USING PHASE CHANGE MEMORY

(75) Inventors: Kwang-jin Lee, Hwaseong-si (KR); Du-eung Kim, Yongin-si (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 749 days.

(21) Appl. No.: 11/892,851

(22) Filed: Aug. 28, 2007

(65) Prior Publication Data

US 2008/0068872 A1 Mar. 20, 2008

(30) Foreign Application Priority Data

Sep. 19, 2006 (KR) .................. 10-2006-0090705

(51) Int. Cl.
*G11C 15/00* (2006.01)

(52) U.S. Cl. ............... 365/49.1; 365/49.17; 365/148; 365/163

(58) Field of Classification Search .......... 365/46, 365/94, 100, 113, 129, 148, 163, 49.1, 49.11, 365/49.12, 49.13, 49.15, 49.16, 49.17, 49.18, 365/50; 257/2–5, 296, E31.047, E27.006; 438/29, 95, 96, 166, 259, 365, 482, 486, 438/597; 977/754

See application file for complete search history.

(56) References Cited

U.S. PATENT DOCUMENTS

| | | | |
|---|---|---|---|
| 6,373,738 B1 * | 4/2002 | Towler et al. | 365/49.1 |
| 6,747,885 B2 | 6/2004 | Park | |
| 6,807,077 B2 * | 10/2004 | Noda et al. | 365/49.17 |
| 2004/0037103 A1 * | 2/2004 | Loughmiller | 365/45 |
| 2006/0067097 A1 | 3/2006 | Lien et al. | |
| 2007/0002608 A1 * | 1/2007 | Hsu et al. | 365/163 |

FOREIGN PATENT DOCUMENTS

JP 2004-206780 7/2004

* cited by examiner

*Primary Examiner* — Richard Elms
*Assistant Examiner* — Harry W Byrne
(74) *Attorney, Agent, or Firm* — Harness, Dickey & Pierce, PLC

(57) ABSTRACT

According to an example embodiment, a CAM cell included in a CAM may include a phase change memory device, a connector, and/or a developer. The phase change memory device may be configured to store data. The phase change memory device may have a resistance that may be varied according to the logic level of the stored data. The connector may be configured to control writing data to the phase change memory device and reading data from the phase change memory device. The developer may be configured to control reading data from the phase change memory device in a search mode in which the data stored in the phase change memory device is compared to the search data.

23 Claims, 5 Drawing Sheets

FIG. 3A

| DATA1 | DATA2 | Write Operation Result |
|---|---|---|
| 0 | 0 | Dont't care (×) |
| 0 | 1 | "0" |
| 1 | 0 | "1" |
| 1 | 1 | Invalid mode |

FIG. 3B

| DATA1 | DATA2 | Read Operation Result |
|---|---|---|
| 0 | 0 | Dont't care (×) |
| 0 | 1 | "0" |
| 1 | 0 | "1" |
| 1 | 1 | Invalid mode |

FIG. 3C

| SD | DATA1 | DATA2 | ML State | Search Operation Result |
|---|---|---|---|---|
| 0 | 0 | 0 | H | Match:don't care (×) |
| 0 | 0 | 1 | H | Match:(0,0) |
| 0 | 1 | 0 | L | No Match |
| 0 | 1 | 1 | L | Invalid Mode |
| 1 | 0 | 0 | H | Match:don't care (×) |
| 1 | 0 | 1 | L | No Match |
| 1 | 1 | 0 | H | Match:(1,1) |
| 1 | 1 | 1 | L | Invalid Mode |

CONTENT ADDRESSABLE MEMORY CELL AND CONTENT ADDRESSABLE MEMORY USING PHASE CHANGE MEMORY

PRIORITY STATEMENT

This application claims priority under 35 U.S.C. §119 to Korean Patent Application No. 2006-0090705, filed on Sep. 19, 2006, in the Korean Intellectual Property Office, the entire contents of which are incorporated herein by reference.

BACKGROUND

1. Field

Example embodiments are directed to a content addressable memory (CAM) cell and a CAM, for example, a CAM cell and a CAM using a phase change memory.

2. Description of Related Art

A CAM may receive external data, compare the received external data to internal data stored therein to determine whether the external data corresponds to the internal data, and output an address based on the comparison result. Each cell of the CAM may include comparator logic. Data input to the CAM may be compared to data stored in each cell of the CAM and the address output from the CAM may represent a matching result. The CAM may be used for applications in which rapid search of patterns, lists and/or image data is required, for example, search engines and look-up tables.

SUMMARY

According to an example embodiment, a CAM cell included in a CAM may include a phase change memory device, a connector, and/or a developer. The phase change memory device may be configured to store data. The phase change memory device may have a resistance that may be varied according to the logic level of the stored data. The connector may be configured to control writing data to the phase change memory device and reading data from the phase change memory device. The developer may be configured to control reading data from the phase change memory device in a search mode in which the data stored in the phase change memory device is compared to the search data.

According to another example embodiment, a CAM may include a match line, a search pair, first and second CAM cells, and/or first and second comparators. The search line pair may include a search line and an inverted search line. The first CAM cell may include a first phase change memory device and a first developer. The first CAM cell may be configured to compare data stored in the first phase change memory device to inverted search data input through the inverted search line by applying a first developing current from the first developer to the first phase change memory device in a search mode. The second CAM cell may include a second phase change memory device and a second developer. The second CAM cell may be configured to compare data stored in the second phase change memory device to search data input through the search line by applying a second developing current from the second developer to the second phase change memory device in the search mode. The first comparator may be configured to connect or disconnect the match line to or from a first voltage source in response to the inverted search data and data stored in the first CAM cell. The second comparator may be configured to connect or disconnect the match line to or from the first voltage source in response to the search data and data stored in the second CAM cell.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 3A is a table illustrating a write operation of the CAM illustrated in FIG. 2.

FIG. 3B is a table illustrating a read operation of the CAM illustrated in FIG. 2.

FIG. 3C is a table illustrating a search operation of the CAM illustrated in FIG. 2.

DETAILED DESCRIPTION OF EXAMPLE EMBODIMENTS

Figure 1:
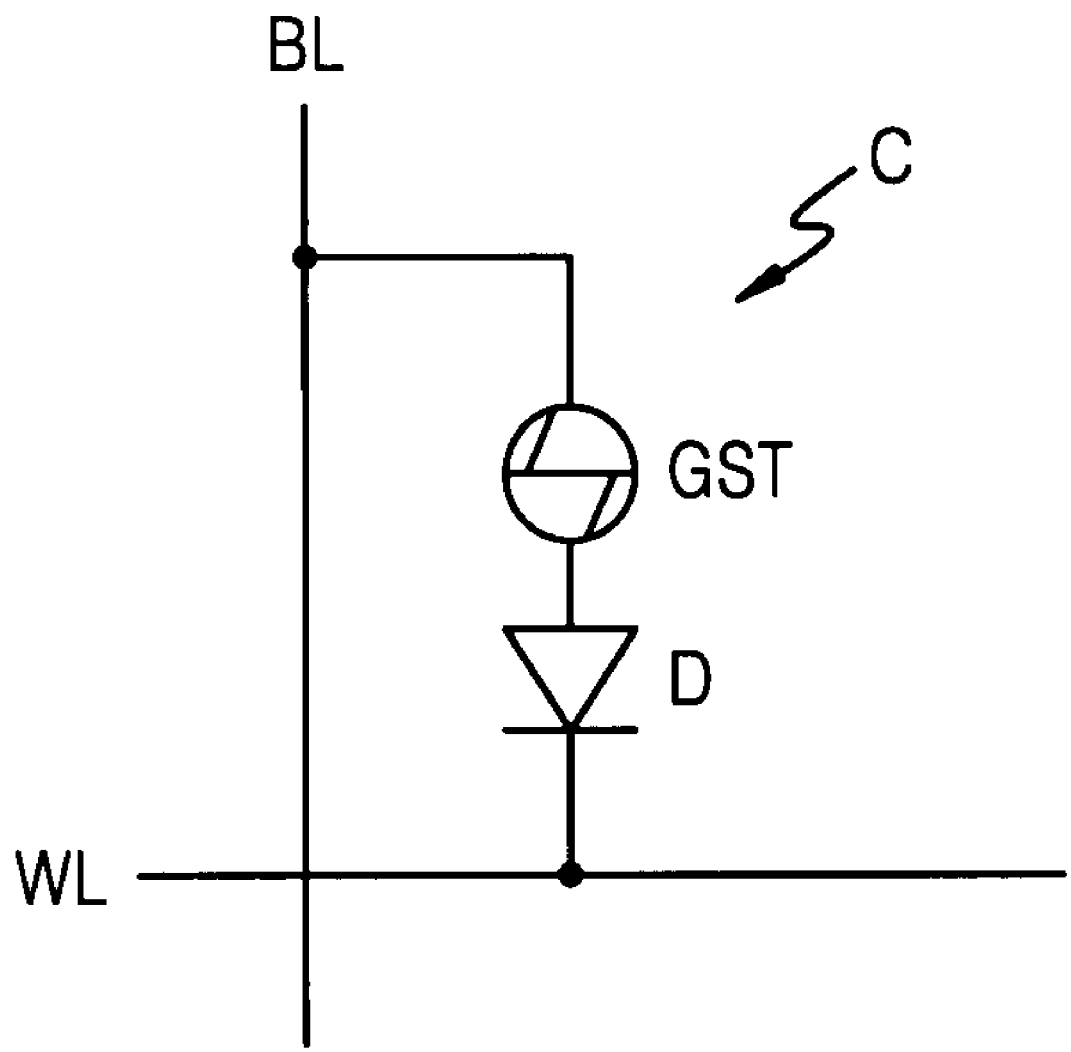
FIG. 1 is an example circuit diagram of a phase random access memory (PRAM).

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A phase random access memory (PRAM) may be a non-volatile memory that may store data using a phase change material, for example, Ge—Sb—Te, whose resistance may be varied according to a phase change, for example, from a temperature variation.

FIG. 1 is an example circuit diagram of a PRAM. Referring to FIG. 1, a unit cell C of the PRAM may include a phase change material GST. The unit cell C may further include a P-N diode D connected to the phase change material GST. The phase change material GST may be connected to a bit line BL and a P junction of the P-N diode D. A wordline WL may be connected to an N junction of the P-N diode D. The phase change material GST of the unit cell C of the PRAM may be in a crystallized or an amorphous state depending on the temperature or heating time used to store data. The phase change material may require temperatures around approximately 900° C. for a phase change, and this temperature may be obtained by Joule heating using a current flowing through the PRAM, for example.

An example write operation of the PRAM will be explained below. A current may be applied to the phase change material to heat the phase change material to higher than the melting temperature of the phase change material, which may then be abruptly cooled. Accordingly, the phase change material may store a data "1" in an amorphous state. This state may correspond to a reset state, for example. The phase change material may be heated to higher than the crystallization temperature thereof, maintained for a given period of time, and cooled. Accordingly, the phase change material may store a data "0" in a crystalline state. This state may correspond to a set state, for example.

A read operation of the PRAM may use a bit line and a wordline to select a specific memory cell and apply a current to the phase change material in the specific memory cell. The current may be used to differentiate a "1" from "0" according to a voltage variation from a resistance change of the phase change material.

Figure 2:
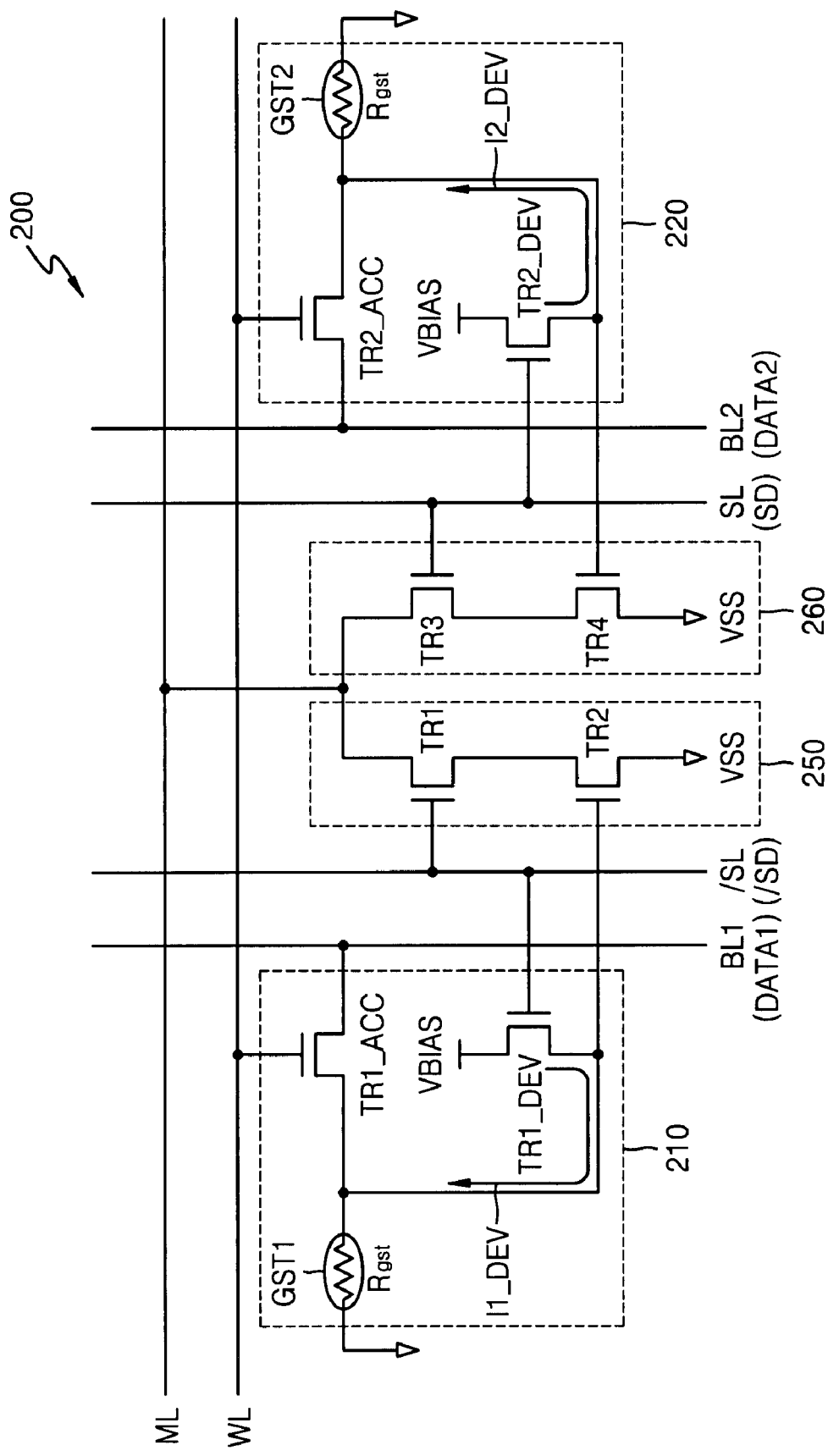
FIG. 2 is a circuit diagram of a CAM including CAM cells according to an example embodiment.

FIG. 2 is an example circuit diagram of a CAM 200 including CAM cells according to an example embodiment. Referring to FIG. 2, the CAM 200 may include a match line ML, a search line pair including a search line SL and an inverted search line /SL, a first CAM cell 210, a second CAM cell 220, a first comparator 250, and/or a second comparator 260.

The first CAM cell 210 may include a first phase change memory device GST1 storing first data DATA1, and a first developer TR1_DEV. The first developer TR1_DEV may apply a first developing current I1_DEV to the first phase change memory device GST1 in a search mode in which the first data DATA1 stored in the first phase change memory device GST1 may be compared to inverted search data /SD input through the inverted search line /SL. The second CAM cell 220 may include a second phase change memory device GST2 storing second data DATA2, and a second developer TR2_DEV. The second developer TR2_DEV may apply a second developing current I2_DEV to the second phase change memory device GST2 in a search mode in which the second data DATA2 stored in the second phase change memory device GST2 may be compared to search data SD input through the search line SL.

The first comparator 250 may connect or disconnect the match line ML to or from a source of a first voltage VSS in response to the inverted search data /SD and the first data DATA1 stored in the first phase change memory device GST1 of the first CAM cell 210. The second comparator 260 may connect or disconnect the match line ML to or from the source of the first voltage VSS in response to the search data SD and the second data DATA2 stored in the second phase change memory device GST2 of the second CAM cell 220.

The first comparator 250 may include a first transistor TR1 and a second transistor TR2. The first transistor TR1 may be turned on or turned off in response to the inverted search data /SD. The second transistor TR2 may be turned on or turned off in response to the first data DATA1 stored in the first phase change memory device GST1. According to an example embodiment, the threshold voltage of the second transistor TR2 may be higher than a minimum voltage applied to the first phase change memory device GST1 and lower than a maximum voltage applied to the first phase change memory device GST1. Accordingly, the second transistor TR2 may be turned on or turned off according to the logic level of the first data DATA1 stored in the first phase change memory device GST1.

The second comparator 260 may include a third transistor TR3 and a fourth transistor TR4. The second comparator 260 may have the same configuration and operation as the first comparator 250, and a more detailed explanation thereof will be omitted.

The first developer TR1_DEV may or may not apply the first developing current I1_DEV to the first phase change memory device GST1 according to the logic level of the inverted search data /SD.

The first developer TR1_DEV may be a first developing transistor TR1_DEV, as illustrated in FIG. 2, for example. The first developing transistor TR1_DEV may be turned on or turned off according to the logic level of the inverted search data /SD. Similarly, the second developer TR2_DEV may be a second developing transistor TR2_DEV, as illustrated in FIG. 2, for example. The second developing transistor TR2_DEV may be turned on or turned off according to the logic level of the search data SD.

The turn on resistance of the first developing transistor TR1_DEV may be greater than a minimum resistance of the first phase change memory device GST1 and smaller than a maximum resistance of the first phase change memory device GST1, and the turn on resistance of the second developing transistor TR2_DEV may be greater than a minimum resistance of the second phase change memory device GST2 and smaller than a maximum resistance of the second phase change memory device GST2.

The first and second developing currents I1_DEV and I2_DEV, which may be respectively output from the first and second developers TR1_DEV and TR2_DEV, may be greater than a minimum current needed for reading data from the first and second phase change memory devices GST1 and GST2 and smaller than a current affecting the states of the first and second phase change memory devices GST1 and GST2.

The first and second developers TR1_DEV and TR2_DEV may be shared by other CAM cells included in the CAM 200. For example, the first and second developers TR1_DEV and TR2_DEV may control an operation of reading data from phase change memory devices included in the other CAM cells in the search mode.

The first CAM cell 210 may also include a first connector TR1_ACC and the second CAM cell 220 may also include a second connector TR1_ACC. The first connector TR1_ACC may supply a write current to the first phase change memory device GST1 in a write mode of writing data to the first phase change memory device GST1, and may provide a read current to the first phase change memory device GST1 in a read mode of reading data from the first phase change memory device GST1. Similarly, the second connector TR2_ACC may supply a write current to the second phase change memory device GST2 in a write mode of writing data to the second phase change memory device GST2, and may provide a read current to the second phase change memory device GST2 in a read mode of reading data from the second phase change memory device GST2.

The CAM 200 may also include a wordline WL and at least one bit line BL1 and BL2.

The CAM 200 may enable the wordline WL, and respectively apply the first data DATA1 and the second data DATA2 to the bit lines BL1 and BL2 in a write mode. The first connector TR1_ACC may operate in response to the enabling of the wordline WL to provide the write current corresponding to the logic level of the first data DATA1 applied to the bit line BL1 to the first phase change memory device GST1. Similarly, the second connector TR2_ACC may operate in response to the enabling of the wordline WL to provide a write current corresponding to the logic level of the second data DATA2 applied to the bit line BL2 to the second phase change memory device GST2.

The CAM 200 may enable the wordline WL and provide a read current to the bit lines BL1 and BL2 in a read mode. The first and second connectors TR1_ACC and TR2_ACC may operate in response to the enabling of the wordline WL to output data read from the first and second phase change resistors GST1 and GST2.

The wordline WL may not be enabled in the search mode.

The first connector TR1_ACC may be a first connecting transistor TR1_ACC, as shown in FIG. 2, for example. The first connecting transistor TR1_ACC may have a gate connected to the wordline WL, a first terminal connected to the bit line BL1, and a second terminal connected to the first phase change resistor GST1. Similarly, the second connector TR2_ACC may be a second connecting transistor TR2_ACC, as shown in FIG. 2, for example. The second connecting transistor TR2_ACC may have a gate connected to the wordline WL, a first terminal connected to the bit line BL2 and a second terminal connected to the second phase change resistor GST2.

The first and second developers TR1_DEV and TR2_DEV may respectively provide the first and second developing currents I1_DEV and I2_DEV, which may be smaller than the write current or the read current to the first and second phase change memory devices GST1 and GST2 in the search mode.

The CAM 200 may be a ternary CAM, for example, or the like.

FIG. 3A is a table illustrating a write operation of the CAM illustrated in FIG. 2. Referring to FIG. 3A, when the CAM 200 illustrated in FIG. 2 operates in the write mode, a 0 may be written to the CAM 200 when the first data DATA1 and the second data DATA2 respectively applied through the first bit line BL1 and the second bit line BL2 are respectively 0 and 1, and a 1 may be written to the CAM 200 when the first data DATA1 is 1 and the second data DATA2 is 0.

FIG. 3B is a table illustrating a read operation of the CAM illustrated in FIG. 2. Referring to FIG. 3B, when the CAM 200 illustrated in FIG. 2 operates in the read mode, a 0 may be read from the CAM 200 when the first data DATA1 and the second data DATA2 respectively stored in the first phase change memory device GST1 and the second phase change memory device GST2 are respectively 0 and 1, and a 1 may be read from the CAM 200 when the first data DATA1 is 1 and the second data DATA2 is 0.

FIG. 3C is a table illustrating a search operation of the CAM illustrated in FIG. 2. An example search operation of the CAM 200 illustrated in FIG. 2 will now be explained for when the match line is precharged to logic high in an initial stage of the search mode.

When the search data SD is 0, the first CAM cell 210 may be operated and the second CAM cell 220 may not be operated. For example, assuming that the first developer includes the first developing transistor TR1_DEV, the first developing transistor TR1_DEV may be turned on and the second developing transistor TR2_DEV may be turned off. Accordingly, the first developing current I1_DEV may be provided to the first phase change memory device GST1, and the first data DATA1 stored in the first phase change memory device GST1 may be read. When the search data SD is 0, the first transistor TR1 may be turned on.

When the first data DATA1 is 0, the second transistor TR2 may be turned off. For example, when both the search data SD and the first data DATA1 are 0, the first transistor TR1 may be turned on and the second transistor TR2 may be turned off. Accordingly, the match line ML may not be connected to the source of the first voltage VSS, for example, a ground voltage VSS, and may maintain a logic high level. Thus, it may be determined that the search data SD and the first data DATA1 are matched to each other.

When the first data DATA1 is 1, the second transistor TR2 may be turned on. For example, when the search data SD is 0 and the first data DATA1 is 1, the first transistor TR1 and the second transistor TR2 may both be turned on. Accordingly, the match line ML may be connected to the source of the ground voltage VSS and become logic low. Thus, it may be determined that the search data SD is not matched to the first data DATA1.

When the search data SD is 1, the second CAM cell 220 may be operated and the first CAM cell 210 may not be operated. For example, the first developing transistor TR1_DEV may be turned off and the second developing transistor TR2_DEV may be turned on. Accordingly, the second developing current I2_DEV may be provided to the second phase change memory device GST2, and the second data DATA2 stored in the second phase change memory device GST2 may be read. When the search data SD is 1, the third transistor TR3 may be turned on.

When the second data DATA2 is 0, the fourth transistor TR4 may be turned off. For example, when the search data SD is 1 and the second data DATA2 is 0, the third transistor TR3 may be turned on and the fourth transistor TR4 may be turned off. Accordingly, the match line ML may not be connected to the source of the ground voltage VSS, and may maintain a logic high level. Thus, it may be determined that the search data SD and the second data DATA1 are matched to each other.

When the second data DATA2 is 1, the fourth transistor TR4 may be turned on. For example, when both the search data SD and the second data DATA2 are 1, the third transistor TR3 and the fourth transistor TR4 may both be turned on. Accordingly, the match line ML may be connected to the source of the ground voltage VSS and become logic low.

Thus, it may be determined that the search data SD is not matched to the second data DATA1.

Figure 4:
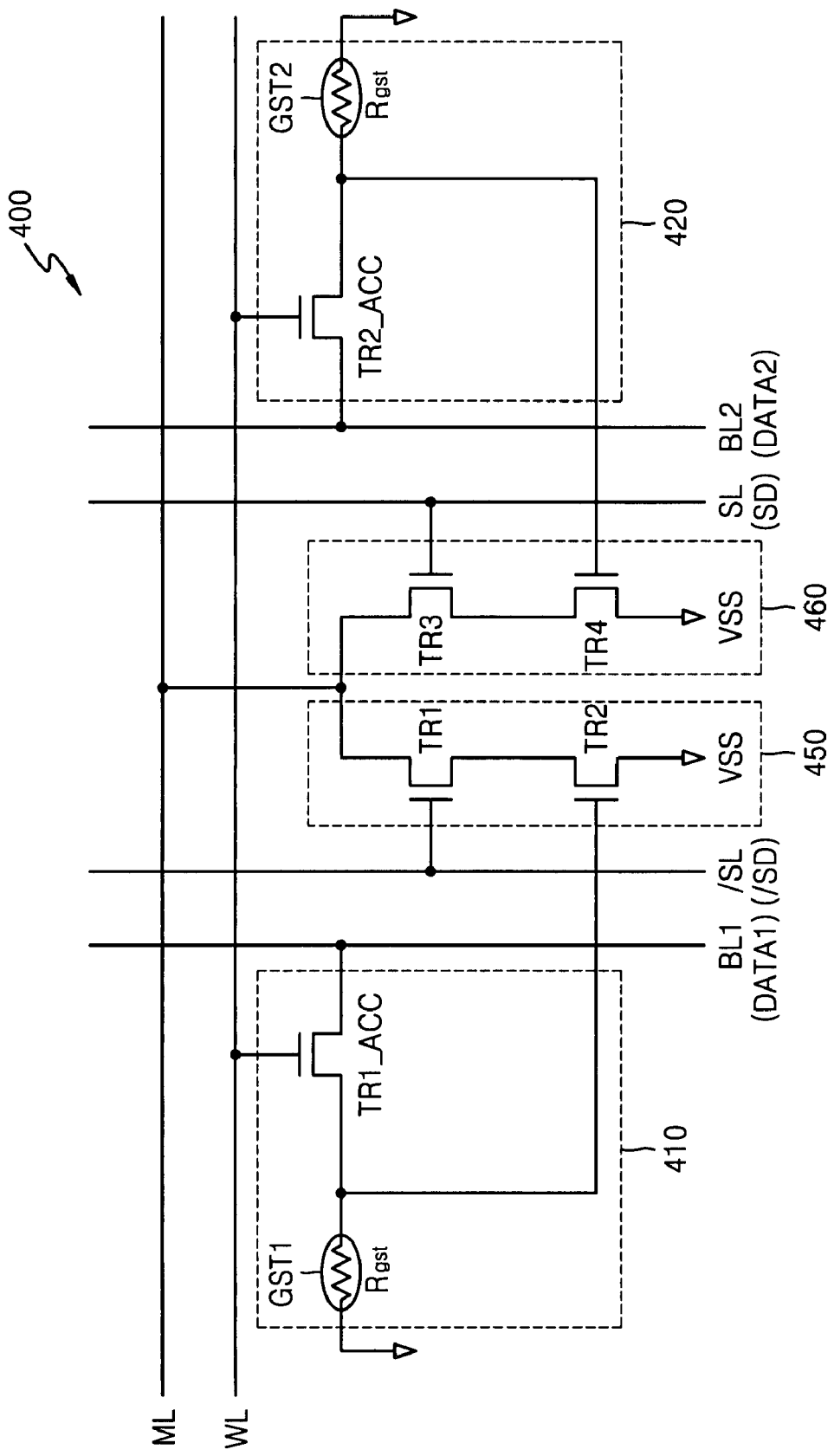
FIG. 4 is a circuit diagram of a CAM including CAM cells according to another example embodiment.

FIG. 4 is an example circuit diagram of a CAM 400 including CAM cells 410 and 420 according to another example embodiment. The CAM cells 410 and 420 of the CAM 400 may be similar to the CAM cells 210 and 220 of the CAM 200 illustrated in FIG. 2, except that the CAM cells 410 and 420 may not include developers. Thus, only the part of the CAM 400 which is different from the CAM 200 illustrated in FIG. 2, will be explained below.

Referring to FIG. 4, the first CAM cell 410 may include a first phase change memory device GST1 and/or a first connector TR1_ACC. The first connector TR1_ACC may provide a write current to the first phase change memory device GST1 through a bit line BL1 in a write mode of writing data to the first phase change memory device GST1. In addition, the first connector TR1_ACC may provide a write current or a read current to the first phase change memory device GST1 through the bit line BL1 in a read mode of reading data from the first phase change memory device GST1.

The first connector TR1_ACC may provide a developing current smaller than the write current and the read current to the first phase change memory device GST1 through the bit line BL1 in a search mode of comparing data stored in the first phase change memory device GST1 to search data.

While the CAM cells 210 and 220 illustrated in FIG. 2 may provide the developing currents to the phase change memory devices through the developers TR1_DEV and TR2_DEV, the CAM cells 410 and 420 illustrated in FIG. 4 may provide the developing current to the phase change memory devices through connectors TR1_ACC and TR2_ACC and bit lines BL1 and BL2.

Figure 5:
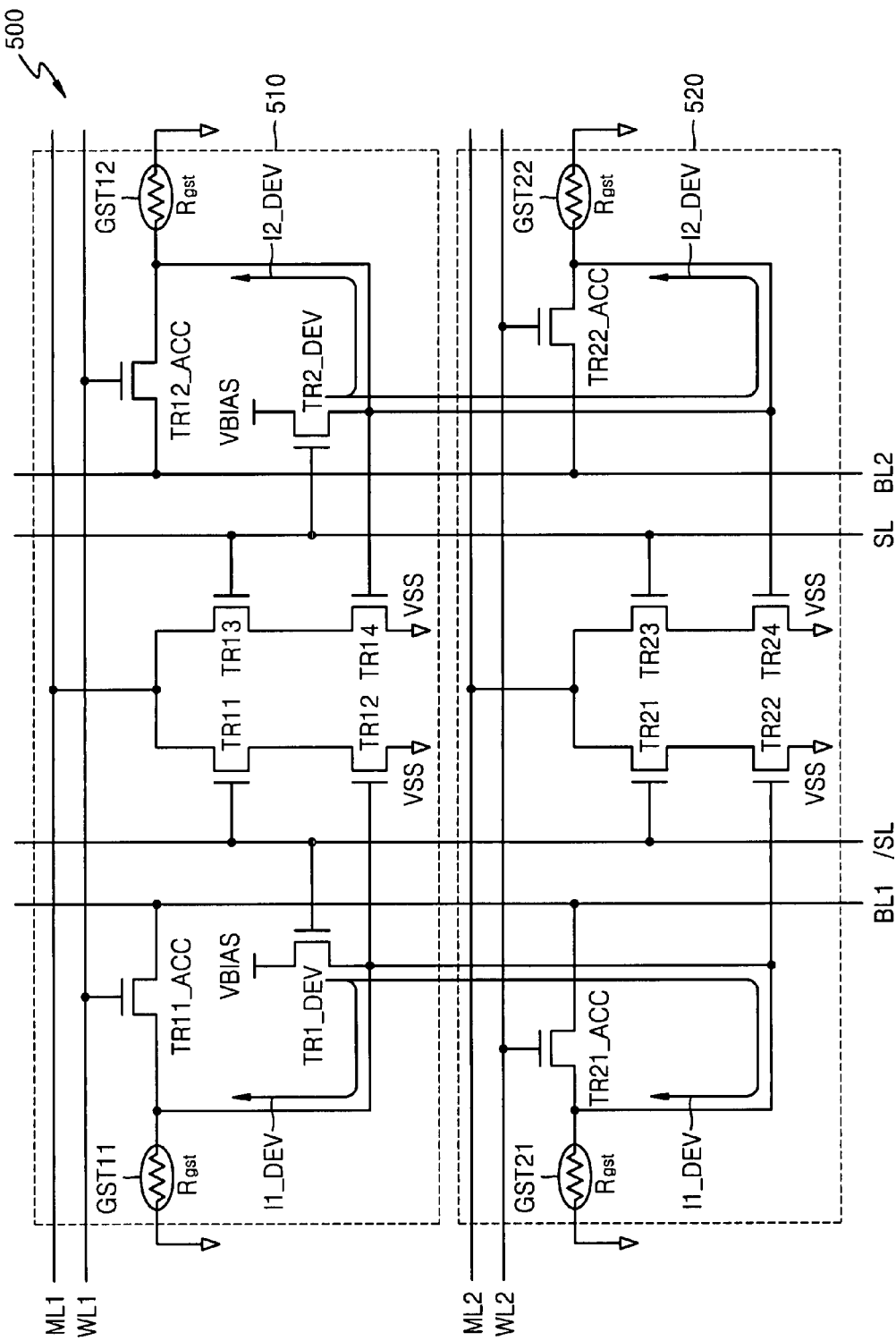
FIG. 5 is a circuit diagram of a CAM structure in which a plurality of CAM cells may share a developer according to another example embodiment.

FIG. 5 is a circuit diagram of a CAM structure in which a plurality of CAM cells may share a developer according to an example embodiment. Referring to FIG. 5, the developer (for example, TR1_DEV) may provide a developing current I1_DEV to a plurality of phase change memory devices GST11 and GST21. Accordingly, the plurality of CAM cells GST1 and GST2 may not require their own respective developers.

While FIG. 5 illustrates that two CAM cells may share a single developer, the number of CAM cells sharing a single developer is not limited to 2.

As described above, the CAM and the CAM cell according to example embodiments may have a relatively faster data search rate.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A content addressable memory (CAM) cell included in a CAM that compares data stored therein to search data input thereto through a search line, the CAM cell comprising:
   a phase change memory device configured to store data, the phase change memory device having a resistance that is varied according to the logic level of the stored data;
   a developer configured to control reading data from the phase change memory device in a search mode in which the data stored in the phase change memory device is compared to the search data; and
   a connector including a gate connected to a wordline, a first terminal connected to at least one bit line and a second terminal connected to the phase change memory device,
   wherein a first terminal of the developer is connected to a bias voltage, a gate of the developer is connected to the search line and a second terminal of the developer is connected to the phase change memory and a comparator.

2. A CAM, comprising:
   a match line;
   a search line pair including a search line and an inverted search line;
   a first CAM cell as claimed in claim 1 including a first phase change memory device and a first developer, the first CAM cell being configured to compare data stored in the first phase change memory device to inverted search data input through the inverted search line by applying a first developing current from the first developer to the first phase change memory device in the search mode;
   a second CAM cell as claimed in claim 1 including a second phase change memory device and a second developer, the second CAM cell being configured to compare data stored in the second phase change memory device to search data input through the search line by applying a second developing current from the second developer to the second phase change memory device in the search mode;
   a first comparator configured to connect or disconnect the match line to or from a first voltage source in response to the inverted search data and data stored in the first CAM cell; and
   a second comparator configured to connect or disconnect the match line to or from the first voltage source in response to the search data and data stored in the second CAM cell.

3. The CAM of claim 2, wherein the first and second developers respectively apply the first and second developing currents to the first and second phase change memory devices according to logic levels of the inverted search data and the search data.

4. The CAM of claim 2, wherein the first and second developers respectively include first and second developing transistors that are turned on or turned off according to logic levels of the inverted search data and the search data.

5. The CAM of claim 4, wherein a turn on resistance of the first developing transistor is greater than a minimum resistance of the first phase change memory device and smaller than a maximum resistance of the first phase change memory device, and a turn on resistance of the second developing transistor is greater than a minimum resistance of the second phase change memory device and smaller than a maximum resistance of the second phase change memory device.

6. The CAM of claim 2, wherein the first and second developers respectively provide the first and second developing currents to the first and second phase change memory devices in an amount greater than a minimum current capable of reading data from the first and second phase change memory devices and smaller than a current affecting the states of the first and second phase change memory devices.

7. The CAM of claim 2, wherein the first and second developers are shared by other CAM cells included in the CAM and control an operation of reading data from phase change memory devices included in the other CAM cells in the search mode.

8. The CAM of claim 2, wherein the first CAM cell includes a first connector that provides a write current to the first phase change memory device in a write mode for writing data to the first phase change memory device and provides a read current to the first phase change memory device in a read mode for reading data from the first phase change memory device, and the second CAM cell includes a second connector that provides a write current to the second phase change memory device in a write mode for writing data to the second phase change memory device and provides a read current to the second phase change memory device in a read, mode for reading data from the second phase change memory device.

9. The CAM of claim 8, further comprising:
the wordline; and
the at least one bit line, wherein
in the write mode, the wordline is enabled, data is applied to the at least one bit line, and the first and second connectors respectively provide a write current corresponding to the logic level of the data applied to the at least one bit line to the first and second phase change memory devices, and
in the read mode, the wordline is enabled, the read current is provided to the at least one bit line, and the first and second connectors respectively output data read from the first and second phase change memory devices.

10. The CAM of claim 9, wherein the wordline is not enabled in the search mode.

11. The CAM of claim 8, wherein the first connector includes a first connecting transistor having a gate connected to the wordline, a first terminal connected to a first bit line, and a second terminal connected to the first phase change memory device, and the second connector includes a second connecting transistor having a gate connected to the wordline, a first terminal connected to a second bit line, and a second terminal connected to the second phase change memory device.

12. The CAM of claim 8, wherein the first and second developers respectively provide the first and second developing currents to the first and second phase change memory devices in the search mode in an amount smaller than the write current or the read current.

13. The CAM of claim 2, wherein the CAM is a ternary CAM.

14. The CAM cell of claim 1, wherein comprising:
the connector is configured to control writing data to the phase change memory device and reading data from the phase change memory device.

15. The CAM cell of claim 14, wherein the developer applies a current to the phase change memory device according to logic levels of the search data.

16. The CAM cell of claim 14, wherein the developer includes a developing transistor turned on or turned off according to logic levels of the search data.

17. The CAM cell of claim 16, wherein a turn on resistance of the developing transistor is greater than a minimum resistance of the phase change memory device and smaller than a maximum resistance of the phase change memory device.

18. The CAM cell of claim 14, wherein the developer provides a developing current to the phase change memory device in an amount greater than a minimum amount of current capable of reading data from the phase change memory device and smaller than an amount of current affecting the state of the phase change memory device.

19. The CAM cell of claim 14, wherein the developer is shared by other CAM cells included in the CAM and controls an operation of reading data from phase change memory devices included in the other CAM cells in the search mode.

20. The CAM cell of claim 14, wherein the connector respectively provides a write current or a read current to the phase change memory device in a write mode for writing data to the phase change memory device or a read mode for reading data from the phase change memory device, and the developer provides a developing current to the phase change memory device in the search mode in an amount smaller than the write current or the read current.

21. The CAM cell of claim 14, wherein the connector is not operated in the search mode.

22. The CAM cell of claim 14, wherein the connector includes a connecting transistor providing the write current or the read current to the phase change memory device.

23. The CAM cell of claim 14, wherein the CAM cell is used in a ternary CAM.

* * * * *